(12) United States Patent
Towery et al.

(10) Patent No.: US 6,610,114 B2
(45) Date of Patent: Aug. 26, 2003

(54) OXIDIZING POLISHING SLURRIES FOR LOW DIELECTRIC CONSTANT MATERIALS

(75) Inventors: Dan Towery, Santa Clara, CA (US); Neil Hendricks, Sonora, CA (US); Paul Schilling, Granite Bay, CA (US); Tian-An Chen, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/882,000

(22) Filed: Jun. 14, 2001

(65) Prior Publication Data

US 2002/0009955 A1 Jan. 24, 2002

Related U.S. Application Data

(62) Division of application No. 09/160,514, filed on Sep. 24, 1998, now Pat. No. 6,270,395.

(51) Int. Cl.⁷ .............................. C09G 1/02; C09G 1/04
(52) U.S. Cl. .............................. 51/308; 51/307; 51/309; 106/3
(58) Field of Search ................. 451/285, 60; 51/307, 51/308, 309; 106/3; 438/692, 693; 216/89

(56) References Cited

U.S. PATENT DOCUMENTS

| | | | |
|---|---|---|---|
| 4,959,113 A | 9/1990 | Roberts | 156/636 |
| 5,340,370 A | 8/1994 | Cadien et al. | 51/308 |
| 5,772,780 A | 6/1998 | Homma et al. | 134/7 |
| 5,783,489 A * | 7/1998 | Kaufman et al. | 438/692 |
| 6,015,506 A * | 1/2000 | Streinz et al. | 252/186.1 |
| 2002/0003225 A1 * | 1/2002 | Hampden-Smith et al. | 252/79.1 |

FOREIGN PATENT DOCUMENTS

EP 0 896 757 2/1999

* cited by examiner

*Primary Examiner*—Michael Marcheschi
(74) *Attorney, Agent, or Firm*—Riordan & McKinzie; Sandra P. Thompson

(57) ABSTRACT

An oxidizing slurry for removal of low dielectric constant materials. The slurry is formed utilizing non-oxidizing particles with a separate oxidizing agent, oxidizing particles alone or reducible abrasive particles with a compatible oxidizing agent. The particles can be formed of a metal oxide, nitride, or carbide material, by itself or mixtures thereof, or can be coated on a core material such as silicon dioxide or can be coformed therewith. A preferred oxidizing slurry is multi-modal in particle size distribution. Although developed for utilization in CMP semiconductor processing the oxidizing slurry of the present invention also can be utilized for other high precision polishing processes.

27 Claims, 8 Drawing Sheets

OXIDIZING POLISHING SLURRIES FOR LOW DIELECTRIC CONSTANT MATERIALS

This application is a divisional of application Ser. No. 09/160,514, filed Sep. 24, 1998 U.S. Pat. No. 6,270,395.

BACKGROUND

1. Field of the Invention

This invention relates to slurries utilized in polishing systems and more particularly to chemical mechanical polishing oxidizing slurries for utilization in semiconductor processing with low-dielectric constant materials.

2. Description of Related Art

Integrated circuits are fabricated upon a substantially flat, disc-shaped silicon wafer or substrate, hereinafter referred to as silicon wafers. The surface of a silicon wafer is subdivided into a plurality or array of rectangular areas onto which are formed photolithographic images, generally identical to one another. Through a series of well-known processing steps, each of the rectangular areas eventually becomes an individual die on the wafer.

Generally the integrated circuit die, especially in very large scale integrated semiconductor circuits, are manufactured by depositing and patterning a conductive layer or layers upon the semiconductor wafer and then a nonconductive layer formed from an insulator, covering the conductive layer. The insulator is typically a silicon dioxide ($SiO_2$) dielectric. The layers are stacked upon one another creating a nonplanar topography, typically caused by the nonconductive or dielectric layers being formed over the raised conductive lines or other features in the underlying conductive layer.

As the integrated circuit devices have become more sophisticated and hence more complex, the number of layers stacked upon one another increases and as the number of layers increase, the planarity problems generally increase. Planarizing the layers during the processing of the integrated circuits thus can become a major problem and a major expense in producing the circuits. The planarity requirements have resulted in a number of approaches, and most recently, chemical mechanical polishing (CMP) techniques have been utilized to planarize the semiconductor wafers. Successful utilization of CMP would be highly desirable since the CMP techniques are less complex compared to the previously utilized methods. The CMP techniques typically utilize a polishing block or pad or plurality of the blocks or pads with a chemical slurry. The blocks are rubbed against the layer to be planarized with the addition of a chemical slurry which aids in obtaining the planarity of the semiconductor wafer for further processing.

The necessary parameters for polishing the $SiO_2$ based intermetal dielectric layers have become well known in the semiconductor industry and the chemical and mechanical nature of polishing and wear of the $SiO_2$ based dielectrics have been reasonably well developed. One problem with the $SiO_2$ dielectrics, however, is that the dielectric constant is relatively high, being approximately 3.9, or higher, depending on factors including residual moisture content. As a result, the capacitance between the conductive layers is also relatively high, and this limits the speed (frequency) at which the circuit can operate. Strategies being developed to reduce capacitance include incorporating metals with lower resistivity values, such as copper, and providing electrical isolation with insulating materials having lower dielectric constants relative to $SiO_2$. Thus, it would be highly desirable to incorporate a low dielectric constant material into semiconductor structures while still being able to utilize the conventional CMP systems for polishing the surface of the resulting dielectric material during the semiconductor wafer processing.

As described herein, "low dielectric constant materials" include "organic polymer materials, porous dielectric materials, whether organic or inorganic, and blended or composite organic and inorganic materials, whether porous or not."Typically these are polymer dielectric materials which include unique chemical, mechanical and electrical characteristics, including dielectric constant values of less than three (3.0). These low dielectric constant materials can include relatively high organic content materials, both low and high organic content materials with a high level of porosity, relatively low organic content materials based upon silicon oxygen type materials and inorganic materials, or materials exhibiting a combination of these properties. The low dielectric constant films can be deposited utilizing a variety of techniques including chemical vapor deposition (CVD), and spin coating. The organic polymer materials generally are mechanically soft and they readily exhibit plastic deformation and hence they can easily be scratched. In contrast, however, to their mechanical sensitivity, organic polymers are often chemically inert. The combination of the characteristics of the polymer dielectric materials makes an aqueous based polymer CMP process difficult. Incorporating these low dielectric constant materials into viable submicron fabrication techniques will necessitate the development of robust CMP processes which Applicants have discovered are not currently available utilizing the $SiO_2$-based CMP processes.

Conventional polishing abrasives, such as $SiO_2$ and $Al_2O_3$, utilized for CMP and related polishing applications in the optical and disk industries are typically produced by chemical precipitation methods or by flame hydrolysis. In chemical precipitation, individual oxysalt particles are typically precipitated from aqueous solutions. The relatively coarse oxysalt particles are filtered, dried, and subsequently subjected to a thermal process called calcination which forms the final, finely divided oxide powder. Low calcination temperatures produce high surface area oxide powders that consist of very small particles. Increasing the calcination temperature typically reduces the total surface area of the powder per unit volume with a corresponding increase in particle size.

In flame hydrolysis, chlorinated or silane precursor materials are subjected to a high temperature, oxyhydrogen flame. Upon entering the flame the precursor reacts with the hydrogen and oxygen, and is transformed to the final oxide product. The particle size, particle size distribution, and surface area of the resulting oxide powder can be controlled by varying the process temperature, the residence time in the reaction chamber, and the relative concentration of the chemical precursors. Oxide powders thus formed consist of very small, primary particles that are strongly adhered to other primary particles in a 3-dimensional network referred to as an aggregate. These aggregates are mechanically robust and are considered irreducible, i.e., they cannot be broken down to the dimensional scale of the primary particles under normal use conditions. The aggregates themselves are often entangled with other aggregates forming agglomerates.

Conventional polishing slurries are derived by incorporating the agglomerated oxide powder into an aqueous suspension with mechanical agitation. Limited suspension stability is obtained by incorporating dispersing agents, or adjusting the suspension pH such that a sufficiently high zeta potential is realized to impart stability through coulombic interactions. Subsequent particle size reduction processes improve suspension stability and polishing performance by breaking down large particle agglomerates.

The metal oxides used as abrasives can be classified into two categories: chemically active oxides and chemically inactive oxides. Chemically active oxides are those oxides which contain metals which can be readily reduced under normal conditions of use. Examples of metals which form active types of oxides are cerium (Ce), iron (Fe), tin (Sn), and zirconium (Zr). Chemically inactive oxides are those oxides which contain a metal that is not readily reduced under normal use conditions, and therefore, can be considered nonreactive. Examples of these oxides are aluminum oxide ($Al_2O_3$), and silicon dioxide ($SiO_2$).

CMP slurries tailored for $SiO_2$ dielectrics, typically incorporate $SiO_2$ abrasives in a high pH aqueous slurry. Current thinking holds that the water hydrolyzes the silicon dioxide material at the silicon dioxide/slurry interface, softening it, thus allowing the silicon dioxide particles in the slurry to abrade the surface of the dielectric. The high pH environment serves two functions: one, to impart stability to the silicon dioxide abrasive slurry and two, to increase the solubility of the hydrolyzed silicon dioxide groups in the aqueous solution. Applicants have discovered, however, that as the organic content of the film increases, the efficiency of conventional silicon dioxide based slurries diminishes rapidly. For example, such an oxide slurry utilized on a typical CMP device, using typical process settings, provides a removal rate of about two thousand five hundred (2500) Angstroms per minute from the surface of the $SiO_2$ dielectric film. However, these same CMP conditions may only provide a removal rate of about two hundred (200) Angstroms per minute on a purely organic polymer film. The conversion from mechanical energy to material removal is thus much lower and unacceptable for use in semiconductor processing.

One CMP solution for low-dielectric constant materials is disclosed in U.S. patent application Ser. No. 09/096722, entitled "Aqueous Metal Oxide Sols As Polishing Slurries For Low Dielectric Constant Materials", filed Jun. 11, 1998, assigned to the same assignee, including one of the present Applicants, which is incorporated herein by reference.

SUMMARY

In accordance with the invention, oxidizing slurries have been developed for removal of low dielectric constant materials. The slurry is formed in a solution utilizing non-oxidizing abrasive particles with an oxidizing agent, oxidizing abrasive particles alone or selected oxidizing abrasive particles with compatible oxidizing agents. The abrasive particles can be formed from a metal oxide, nitride or carbide material, by itself or mixtures thereof, or can be coated on a core material such as silicon dioxide or can be coformed therewith. A preferred oxidizing slurry is multi-modal in particle size distribution. Although developed for utilization in CMP semiconductor processing the oxidizing slurry of the present invention also can be utilized for other precision polishing processes.

BRIEF DESCRIPTION OF DRAWINGS

Utilization of the same reference numerals in different figures indicates similar or identical elements, structurally and/or functionally.

DETAILED DESCRIPTION OF THE PREFERRED EMBODIMENT

Figure 1:
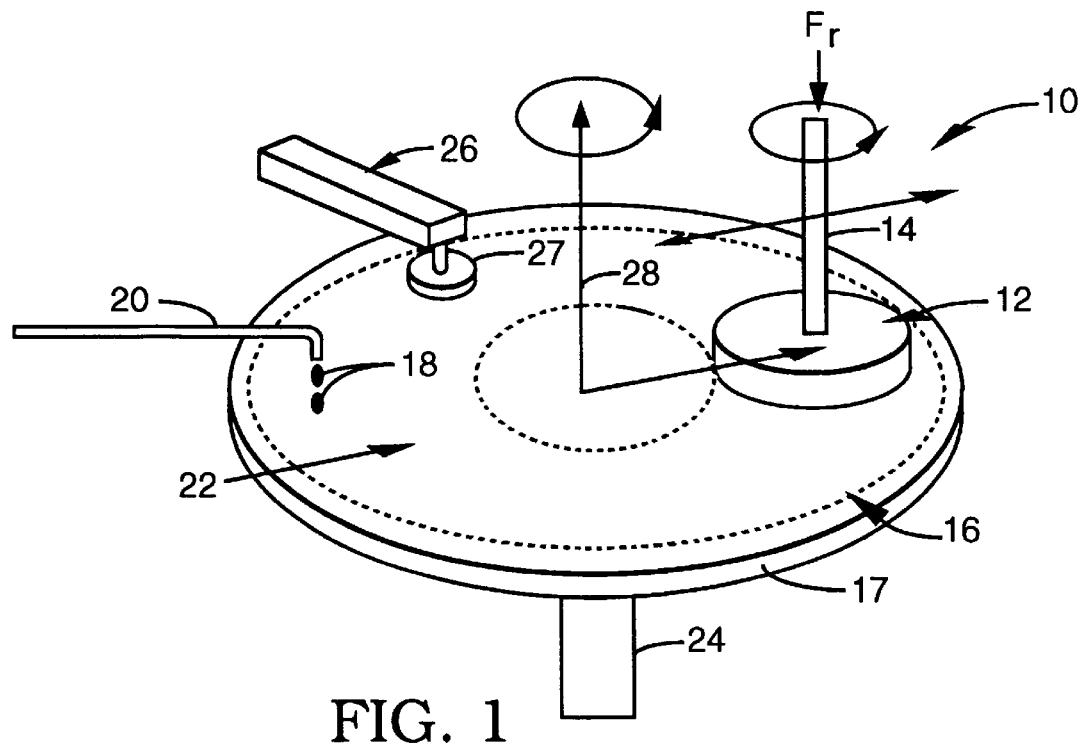
FIG. 1 illustrates an idealized perspective view of a rotary type CMP device in which the oxidizing slurry of the present invention can be utilized.

To facilitate description of the oxidizing slurry and the method and apparatus for utilizing the slurry of the present invention, an idealized CMP system or device will be described and is designated generally by the numeral 10 in FIG. 1. The CMP device 10 is a rotary polishing device. However, the oxidizing slurry of the present invention also can be utilized with any type of CMP device which provides relative motion between the dielectric material to be polished and a polishing surface, such as orbital or linear CMP devices. The device 10 is described merely to aid in the understanding of a primary use of the present invention.

The CMP device 10 is of the type of polishing tool which has a mechanical design based upon the semiconductor wafer polishing tools. During CMP of a layer on a semiconductor wafer, the semiconductor wafer (not illustrated) is mounted by well known techniques in a rotary and radially oscillating semiconductor wafer carrier 12. The carrier 12 is mounted to a shaft 14 which imparts the required motion and forces on the carrier 12 in a conventional manner. The surface of the semiconductor wafer is pressed against a rotating polishing pad or block 16 or array of pads or blocks by a force FT. A chemically abrasive slurry 18, typically including abrasive particles in a controlled pH solution, is added to the polishing pad 16 via a supply line or conduit 20.

The slurry 18 is added to a wafer track 22, which is an annular ring or zone formed by the rotating polishing pad 16 and the rotating and oscillating carrier 12. The polishing pad 16 is also mounted on a shaft 24, which imports the required rotational movement onto the polishing pad 16. The shaft 24 typically is axially fixed, but could also provide a portion or all of the force $F_T$, if so desired.

Figure 2:
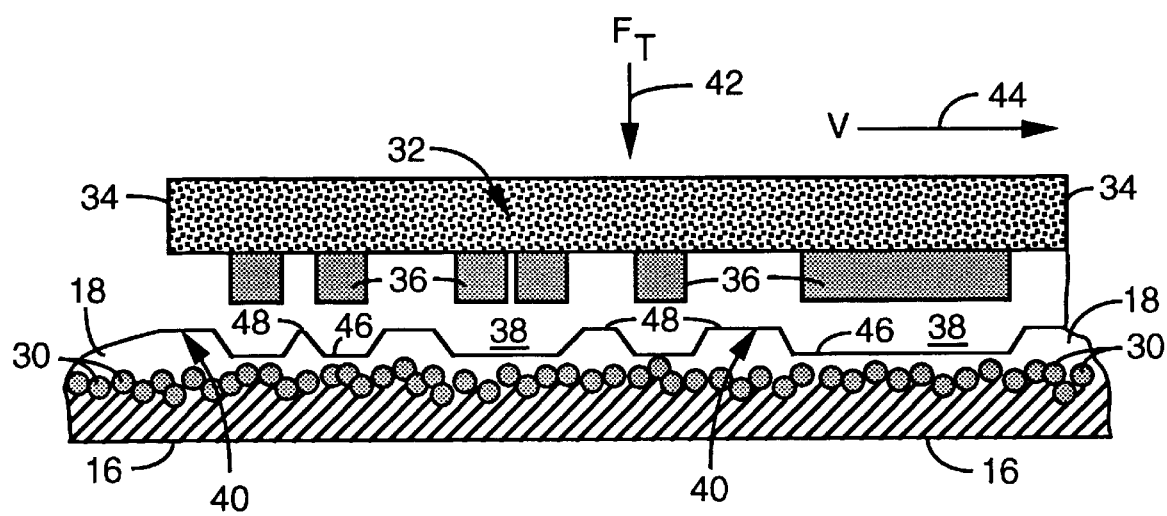
FIG. 2 illustrates an idealized cross section of a semiconductor wafer in a CMP process.

The slurry 18 provides both a chemical and a mechanical action on the surface of the semiconductor wafer to provide a controlled removal of material from and planarization of the semiconductor wafer surface, as will be described more fully with respect to FIG. 2. The semiconductor wafer typically is held by a retaining ring or other retaining mechanism in the gimbaled, rotating carrier 14. The polishing pad 16 typically is formed from polyurethane or from polyurethane impregnated fiber, attached, such as by adhesive tape in a conventional manner, to a rigid, temperature controlled base or plate 17. It is believed that during the CMP process, the semiconductor wafer is supported by hydrodynamic forces and by direct support from the abrasive particles in the slurry 18 resting in recesses or deformities in the pad 16 at the pad-semiconductor wafer interface.

The conventional CMP process includes an additional process step referred to as pad conditioning. The pad conditioning typically is performed with a pad conditioner device 26, which typically includes a diamond-impregnated ring or disk tool 27. During the CMP process ("in-situ" conditioning) or just following the polishing process ("ex-situ" conditioning), the conditioner ring or tool 27 is pressed against the surface of the polishing pad 16. The pressure applied and the relative motion (generally radially/oscillating) erodes a small portion of material from the surface of the polishing pad 16. This pad erosion is typically required to maintain the pad surface free of material build-up associated with the CMP products, such as spent abrasives and dielectric material removed from the surface.

The pad conditioning maintains the micro-texture of the polishing pad 16, which tends to smooth out due to viscoelastic flow caused by the CMP process. Without pad conditioning, the removal rate and uniformity of removal of the semiconductor wafer dielectric material is typically not uniform between semiconductor wafers, hence preventing reliable commercial production of the semiconductor wafer.

The size of the conditioner ring or tool 27 depends upon the size and the type of the CMP device 10, but the disk type conditioner 27 usually has a smaller diameter than that of the semiconductor wafer. A ring type conditioner (not illustrated) generally is larger than the diameter of the semiconductor wafer. Therefore, in practice, the ring type conditioner is positioned at a fixed radial distance from the central axis 28 of the polishing pad 16. The ring type conditioner rotates and provides erosion across the width of the semiconductor wafer track 22.

In the form of a disk type conditioner 27, the disk typically is smaller than the semiconductor wafer and hence is oscillated across the semiconductor wafer track 22 to provide the necessary abrasion. During the pad conditioning, the location and rotation rate of the conditioner 27 affects the uniformity of erosion in the semiconductor wafer track 22, which influences the removal rate stability and the polishing uniformity of the semiconductor wafer surface.

The CMP process continues for a predetermined time to obtain the desired amount of semiconductor wafer material removal. The predetermined time calculation is based upon the rate of removal of the semiconductor wafer dielectric material and the required amount of dielectric material to be removed. The removal amount is chosen such that at the end of the CMP process, the semiconductor wafer surface has achieved the desired planarity and the desired dielectric material thickness.

Typically, the CMP process can utilize a pressure of about $48\times10^3$ Pa (7.0 psi), a velocity of about 0.54 meter per second and a process time of about three (3) minutes. Referring to FIG. 2, the slurry 18 is illustrated on the polishing pad 16 and includes a plurality of abrasive particles 30. The carrier 14 is not illustrated; however, a portion of a semiconductor wafer 32 which is mounted in the carrier 14 is illustrated.

The semiconductor wafer 32 includes a silicon base layer 34, upon which are formed a plurality of deposited conductive patterned metal features 36. The metal features 36 then are covered by a deposited dielectric material layer 38. The layer 38 has a surface 40, which is not planar since it mirrors the metal features 36 underlying the layer 38. The surface 40 then must be planarized before the next photolithography step can be performed. The polishing pad 16 and the slurry 18 provide a higher localized pressure against the regions of higher topography on the surface 40 to remove these features and planarize the surface 40.

The pad 16 has a hardness and is applied at a force FT (shown by an arrow 42) applied at a velocity V, also shown by an arrow 44. During the CMP process surface regions of high topography on the surface 40, such as regions or areas 46 are subjected to higher localized contact and hence higher polishing pressures, than regions of low or reduced topography, such as a region or area 48. The CMP process is designed to selectively remove the regions or areas 46, while minimizing the removal of the regions 48. Assuming the surface of the region 48 is planar and of the right depth, a perfect CMP process would remove all of the regions 46 to be parallel to the surface of the regions 48. This selectivity of the CMP process is a measure of the planarization efficiency of the process.

During the CMP process, the dielectric material 38 is removed by the combined action of chemical and mechanical processes. The chemical energy is supplied by the slurry's liquid media and additionally in some cases by the abrasive particles 30 themselves. CMP slurries which are tailored for removal of dielectric materials typically are aqueous and generally have a controlled pH. The mechanical energy is generated by the relative motion and pressure between the dielectric 38 and the surface of the pad 16 with the abrasive slurry 18 entrained therebetween, as illustrated in FIG. 2.

This relative motion generates mechanical energy, W, in accordance with the principle of mechanical work;

$$W = \int F_T \mu_s ds$$

In the equation, $F_T$ is the force normal to the surface 40, $\mu_s$ is the coefficient of sliding friction between the wafer surface 40 and the pad 16 and ds is a differential element of length.

By transferring the differential element of length to a differential element of time, the following equation is obtained.

$$W = \int F_T \mu_s v dt$$

In this equation, v is the relative velocity between the pad 16 and the dielectric 38. Integration of this equation yields the total work generated during the specified time domain. Thus, increasing any of the variables $F_T$, $\mu_s$, v or the polishing time t increases the material removal during the CMP polishing process. As is well known, F. W. Preston recognized the relationship between work and the amount of material removal and formalized the relationship in an equation, now known as the Preston equation, which can be stated in differential form as:

$$\frac{dh}{dt} = K_p P \frac{ds}{dt}$$

In the Preston equation, $K_P$ is the Preston coefficient, P is the polishing pressure acting normal to the surface of the wafer surface 40 and ds/dt is the instantaneous relative velocity between the pad 16 and the surface 40.

As previously mentioned, the CMP process parameters for the conventional $SiO_2$-based dielectric layer 38 are well known. To achieve the desired decrease in the dielectric constant from the 3.9 constant of the $SiO_2$ material, requires a new lower dielectric constant material. The development of these dielectric materials has focused on polymer based materials, such as the following:

1. Poly (arylene) Ethers
2. Poly (naphthylene) Ethers
3. Polyimides
4. Poly (benzocyclobutenes) and perfluorocyclobutanes (BCB and PFCB)
5. Polyquinolines
6. Hydrido or Alkylsilsesquioxanes
7. Polytetrofluoroethylene (PTFE)
8. Paralyne-N, Paralyne-F
9. Siloxanes
10. Organic substituted silazanes
11. Polyquinoxalines
12. Various copolymers derived from 1–11.

These dielectric polymer materials include a significant increase in the organic material content over the $SiO_2$-based dielectric material. As also previously discussed, the conventional CMP conditions and slurries are much less effective as the organic content increases. Although the major focus has been on polymer materials, as stated previously, the low dielectric constant materials can also include porous dielectric materials, whether inorganic or organic and mixed organic and inorganic materials.

One particular low dielectric constant material which has been utilized for testing in accordance with the present invention is a poly(arylene)ether spin-on film, cured in a nitrogen atmosphere, yielding a dielectric constant of about 2.8 when using a voltage signal applied at one (1) Megahertz. The dielectric material is stable, without any substantial outgassing to a processing temperature of approximately four hundred (400) degrees Celsius to make the dielectric material compatible with the required back end of the line semiconductor wafer processing temperature requirements. The dielectric material has an effective gap fill below 0.12 microns for subtractive aluminum etch processing requirements. The conventional $SiO_2$ slurry utilized in the CMP process with this polymer dielectric material was essentially ineffective at removing the dielectric material.

Applicants postulated that these types of organic polymer dielectric materials, as well as other low dielectic constant materials, effectively will be removed with a mechano-chemical mechanism. Applicants tested this hypothesis by preparing and polishing test blanket and pattern wafers which incorporated a cured spin coated, organic dielectric film. The thermal bake and cure process used to prepare the films is as follows:

| Process Step | Description |
| --- | --- |
| 1 | 3 sec 0 rpm (dispense) |
| 2 | 5 sec 500 rpm (spread) |
| 3 | 60 sec 2000 rpm (spin) |
| 4 | Bake: 1 min @ 150 Celsius in $N_2$ |
| 5 | Cure: 1 hr @ 425 Celsius in $N_2$ |

The testing was performed in conventional single-head CMP processing equipment, such as an IPEC 472 made by IPEC Planar Corporation of Phoenix, Az., a fifteen (15) inch platen table top polisher by Engis Corporation of Wheeling, Ill., and a Teres polisher made by Lam Research Corporation of Fremont, Calif.

Figure 3:
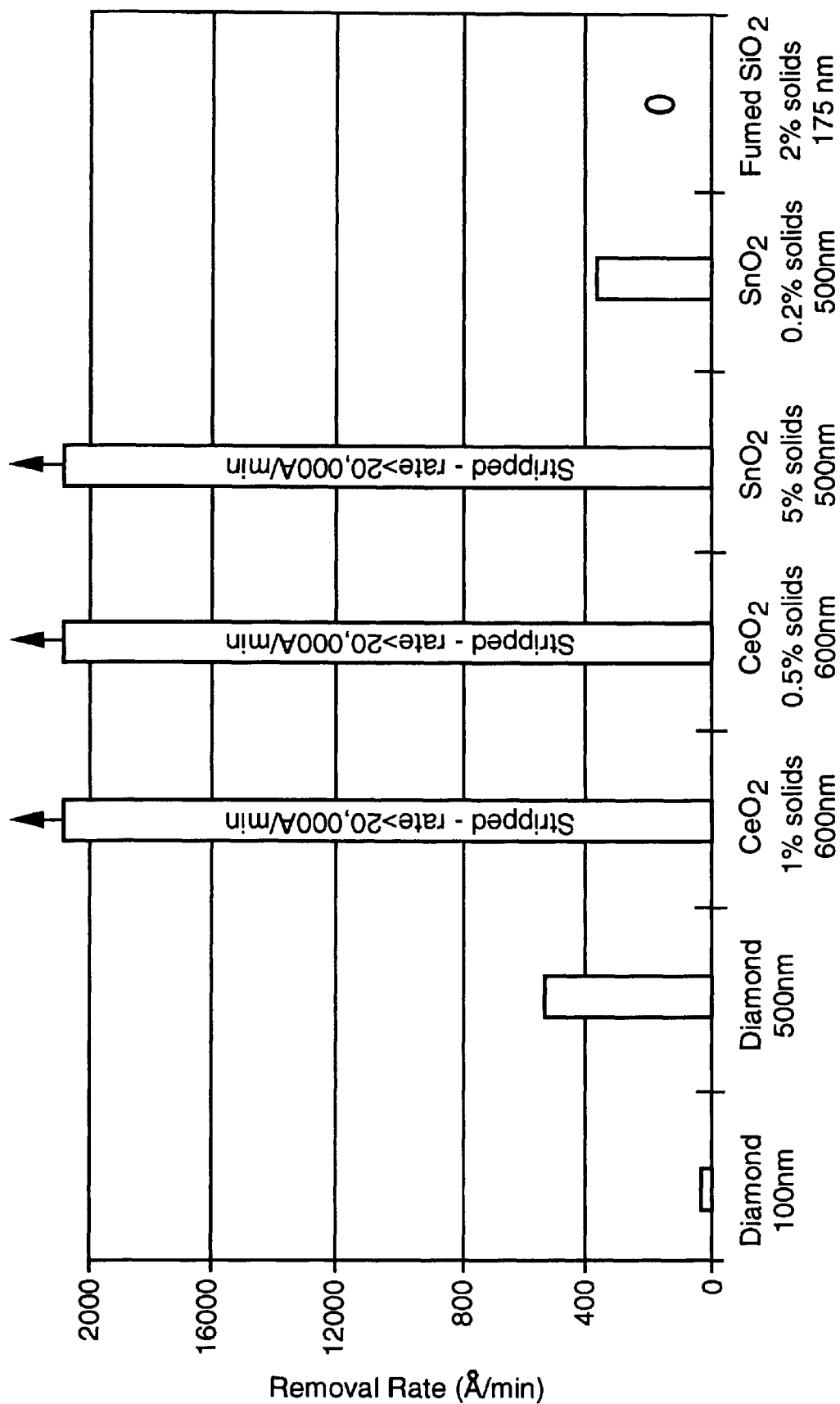
FIG. 3 is a graph of results utilizing conventional abrasives on a low dielectric constant polymer material.

Referring to FIG. 3, the removal rate of the low dielectric constant polymer material utilizing some conventional abrasives is illustrated. These abrasives were dispersed in de-ionized (DI) water only and no chemical additives were utilized to enhance their performance. CMP was performed for two (2) minutes at a polishing pressure of $23 \times 10^3$ Pa (approximately 3.3 pounds per square inch (psi)) and a linear velocity of 0.48 meters per second (m/s). The hardest abrasive utilized is diamond and if the mechanical aspects were solely responsible for the dielectric material removal, then the one hundred (100) or five (500) nanometer (nm) diamond abrasives should have produced the greatest rate of removal. This clearly does not happen. The fumed amorphous $SiO_2$ manufactured by a conventional flame hydrolysis technique produced no dielectric polymer material removal. The chemically active oxide abrasive particles, cerium oxide ($CeO_2$) and stannic oxide ($SnO_2$) completely removed all of the dielectric polymer material and repeated tests proved that the material was stripped within seconds. This uncontrollable removal is undesirable, but clearly suggests a mechano-chemical removal mechanism.

Figure 4:
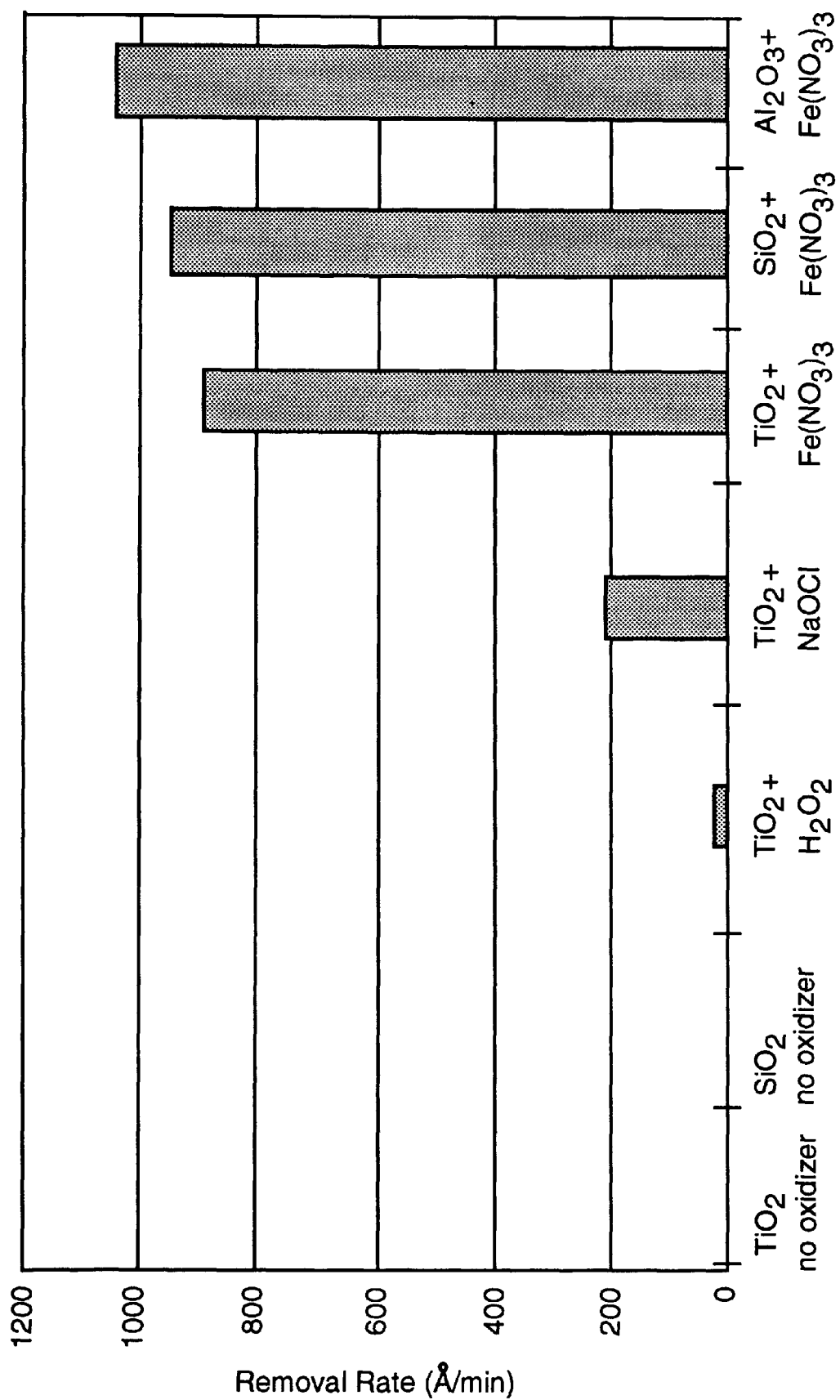
FIG. 4 is a graph of results comparing non-oxidizing particles with and without the addition of oxidizing agents forming oxidizing slurry embodiments of the present invention.

Applicants then selected and tested a series of specially prepared oxidizing abrasive slurries. Because of the chemical attributes of these oxidizing slurries, the slurries achieved significantly different results, as illustrated in FIG. 4, indicating substantially different CMP polishing properties. In the present embodiment of this invention, the abrasive particles were formed by well-known flame hydrolysis (fumed) or sol methods. Examples of the sol methods are disclosed in U.S. Pat. Nos. 3,282,857; 4,588,576; 5,004,711 and 5,238,625. Abrasive slurries derived from these methods can be tailored such that the slurry includes individual and segregated primary particles, or if so desired, the particle size can be grown to the desired dimension in a repeatable, controlled fashion. The polishing pressure ($23 \times 10^3$ Pa) and the linear velocity (0.48 m/s) were the same.

Referring to FIG. 4, a fumed $TiO_2$ or sol $SiO_2$ particle slurry in DI water, without an oxidizing agent (no oxidizer) resulted in little or no removal of the dielectric material. The $SiO_2$ particles were on the order of seventy (70) nm in diameter and were dispersed at about two (2) per cent solids in DI water to form the slurry. The $TiO_2$ particles were on the order of one hundred and seventy-five (175) nm in diameter and were dispersed at about two (2) per cent solids in the DI water.

The $TiO_2$ particles then were combined with different oxidizing agents to form oxidizing slurry embodiments of the present invention. When combined with hydrogen peroxide ($H_2O_2$), only a small removal rate on the order of about fifty (50) Angstroms per minute was achieved. When combined with Sodium Hypochlorite (NaOCl), a removal rate of just over two hundred (200) Angstroms per minute was achieved. A removal rate of about nine hundred (900) Angstroms per minute was achieved when the $TiO_2$ particles were combined with ferric nitrate ($Fe(NO_3)_3$).

Figure 5C:
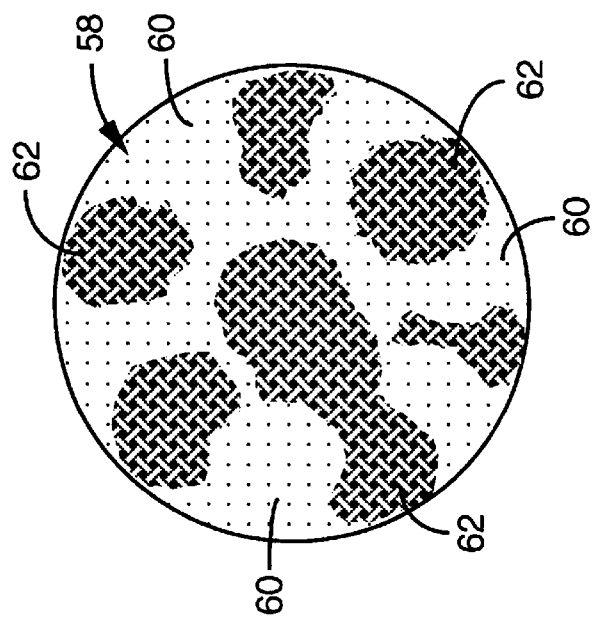
FIGS. 5A, 5B and 5C are cross sections of some idealized abrasive particle embodiments of the present invention.
Figure 5B:
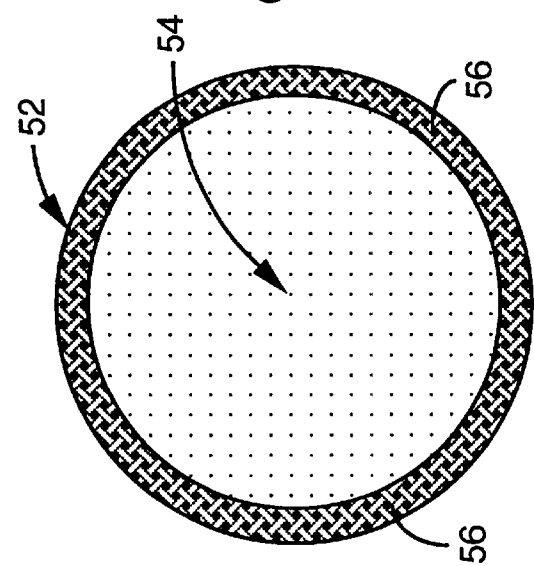

The $SiO_2$ particles then were combined with $Fe(NO_3)_3$, which resulted in a removal rate of about nine hundred and fifty (950) Angstroms per minute. Another abrasive particle $Al_2O_3$ also was combined with $Fe(NO_3)_3$, which resulted in a removal rate of about one thousand and fifty (1050) Angstroms per minute. The $Al_2O_3$ particles had a diameter of about seventy (70) nm and were formed as a sol by coating $Al_2O_3$ over an $SiO_2$ core, as illustrated in FIG. 5B. Clearly, the addition of the oxidizing agent enabled ineffective abrasive particles to be effectively utilized as a polishing agent in the oxidizing slurries of the present invention.

Figure 5A:
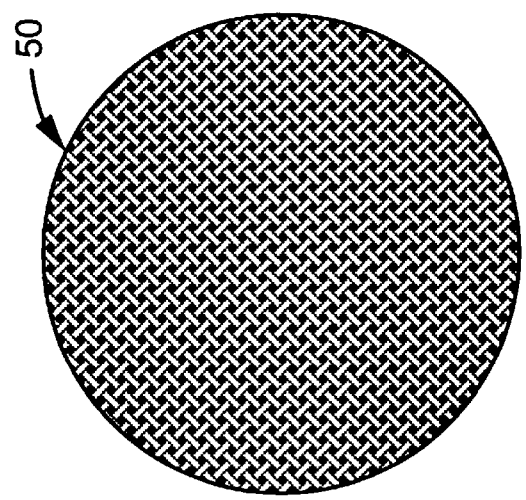

The particles utilized in the oxidizing slurries of the present invention can have several different structures. First, the particles can be formed as sols and will have a generally spherical shape as illustrated in FIGS. 5A–5C. The particles also can be formed by the conventional flame hydrolysis techniques and then generally would not be spherical, but would be of more irregular shapes. For convenience and ease of illustration, the particle structures illustrated in FIGS. 5A–5C, are generally spherical; however, the particle structures of the present invention are not so limited.

Referring to FIG. 5A, a first particle 50 is illustrated. The particle 50, whether formed in solution as a sol and/or calcined, is formed of a substantially unitary material, such as $TiO_2$, $SiO_2$ or $Al_2O_3$. Referring to FIG. 5B a second particle 52 is illustrated, which includes a core material 54 and an outer coating 56. For example, as utilized in FIG. 4, the core 54 can be formed from $SiO_2$, while the coating 56, can be $Al_2O_3$. The core material 54 can be chosen for cost, density, ease of manufacture and/or other considerations. The density of the particles 52 is important, because for a given weight of particles in the oxidizing slurries, the lower density particles will be numerically higher in number and generally are easier to suspend in the slurry. An increase in the number of the particles 52 will increase the polishing contact area and hence generally will increase the removal rate of the dielectric material.

A third composite structure particle 58 also can be formed, as illustrated in FIG. 5C. The particle 58 can be coprecipitated from a mixture of materials, such as $Al_2O_3$ and $SiO_2$, for example. This results in a mixed phase particle having regions 60 of a first material intermixed with regions 62 of a second material.

The oxidizing slurries of the present invention include an abrasive particle and an oxidizing agent. The oxidizing slurries can include particles, such as those formed from cerium dioxide ($CeO_2$), vanadium pentoxide ($V_2O_5$), (zirconium oxide ($ZrO_2$), manganese oxide ($Mn_2O_3$), tin oxide ($SnO_2$), antimony pentoxide ($Sb_2O_5$) or manganese dioxide ($MnO_2$), which provide both the abrasive and the oxidation functions. The oxidizing slurries of the present invention also can include abrasive particles which provide little or no oxidation, which are combined with a separate oxidizing agent, such as ferric nitrate ($Fe(NO_3)_3$), cupric nitrate ($Cu(NO_3)_2$), zirconyl nitrate ($Zro(NO_3)_2$), ferric chloride ($FeCl_3$), potassium permanganate ($KMnO_4$), potassium ferricyanide ($K_3Fe(CN)_6$), nitric acid ($HNO_3$), potassium iodate ($KIO_3$), organic and inorganic peroxides, including hydrogen peroxide ($H_2O_2$), peracetic acid ($C_2H_4O_3$), and benzoyl peroxide ($C_{14}H_{10}O_4$) The listed metal salts, for example, can provide reducible metal ions in the slurry, and these ions may be capable of oxidizing the low dielectric constant materials. The resulting oxidizing slurries also can include pH modifiers and surfactants, if desired to improve suspension characteristics.

When forming the oxidizing slurries of the present invention, a combination of an abrasive particle and an oxidizing agent or oxidant must be evaluated for electrochemical compatibility, since some combinations will form spontaneous electrochemical cells. In an oxidation/reduction (redox) reaction, there is a transfer of electrons from the reductant to the oxidant. In the case of the CMP slurry, the polymer film transfers electrons to the oxidant of the slurry and is therefore converted to a higher valence state, while the oxidant becomes reduced in its valence state. The potential for this reaction to occur can be described in the form of half-reactions; that is the conversion of one reactant from one valence state to another. The potential for this half reaction to occur is quantitatively described using a reduction potential, which is a voltage relative to a standard hydrogen ion/hydrogen reduction, which is defined by convention as having a zero volt reduction potential.

In order to describe a complete oxidation/reduction reaction, two half reactions are combined to create a full redox reaction. Taking the sum of the reduction potentials associated with each half reaction determines whether the reaction described will be spontaneous, that is having a total positive potential, or nonspontaneous, requiring an external supply of electrons by having a total negative potential. For example, the reaction of reduction of copper (II) ions by metallic zinc is described by the following half-reactions:

$Zn \rightarrow Zn^{2+}$ 2e 0.762 V $Cu^{2+} + 2e \rightarrow Cu$ 0.312 V

Giving an overall reaction of:

$Zn + Cu^{2+} \rightarrow Cu + Zn^{2+}$ 1.074 V

The reduction potentials for a variety of half reactions can be found in any number of chemistry references, such as the *CRC Handbook of Chemistry and Physics or Lange's Handbook of Chemistry*.

In the case of the CMP slurry described, various transition metals or other compounds having low reduction potentials are used in order to effect oxidation of the polished surface. With certain metal oxides, the oxide provides both an abrasive action and acts as an oxidant for the polished surface, or a separate abrasive and oxidant can be used. Because the spontaneity of redox reactions is dependent upon the relative difference between the two half reactions involved, when a slurry is to be prepared using a separate abrasive and oxidant, it is necessary to determine whether or not the two compounds are compatible; that is, whether they will spontaneously engage in a redox reaction or not. If they do, the oxidative capacity of the slurry toward the polished substrate will be substantially reduced or eliminated due to reaction with the abrasive component:

$MnO_2 + 2H^+ + H_2O_2 \rightarrow O_2 + Mn^{2+}$ 0.529 V $2Ce^{4+} + H_2O_2 \rightarrow O_2 + 2H^+ + Ce^{3+}$ 1.025 V Whereas a nonspontaneous cell is formed as:

$ZrO_2 2H^{30} + 2H_2O_2 \rightarrow Zr + 2H_2O + O_2$ -2.943 V

Also, only one oxidant should be used, as certain combinations of oxidants will react with each other, thereby reducing the overall oxidizing capacity of the slurry:

$2Fe^{3+} + H_2O_2 \rightarrow O_2 + 2h^+ + 2Fe^{2+}$ 0.847 V

If compatible, the oxidizing reaction aids in the removal of the dielectric material, while if incompatible, the oxidizing reaction occurs between the particle and the oxidant and does not materially aid in and may prevent the material removal.

Figures 6A, 6B:
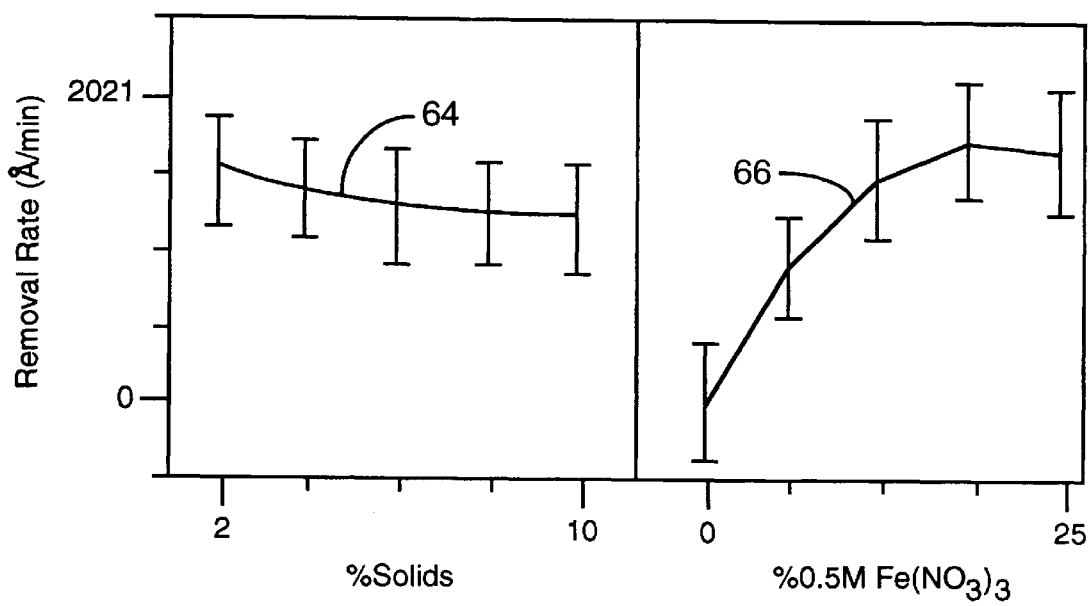
FIGS. 6A and 6B are graphs of the removal rate of one abrasive particle embodiment of the present invention with a varying percent of solids and oxidizers.

Referring to FIGS. 6A and 6B, a graph of the removal rate of one particle embodiment of the present invention is illustrated, with a varying percent solids (particles) in FIG. 6A and a varying oxidant concentration in FIG. 6B. This is a full factorial Design of Experiment (DOE) illustration, which simultaneously examines the role of abrasive and oxidant concentrations.

In FIG. 6A, a curve 64 illustrates the removal rate results for an increasing percentage of solids (particles) in the oxidizing slurries of the present invention. In this example, the particles are one hundred and seventy-five (175) nm, fumed $SiO_2$ particles, like the particles 50. The increased number of particles appears to limit the oxidizing effect and in fact does not result in an increased removal rate.

In FIG. 6B, a curve 66 illustrates the removal rate of the $SiO_2$ particle oxidizing slurries of the present invention as the percentage (concentration) of an oxidizer ($Fe(NO_3)_3$) is increased in the DI water/particle solution. The removal rate peaks at about twenty (20) percent volume (about four (4) percent by weight) of the one half (0.5) molar (M) oxidizer in the oxidizing slurries.

Figure 7:
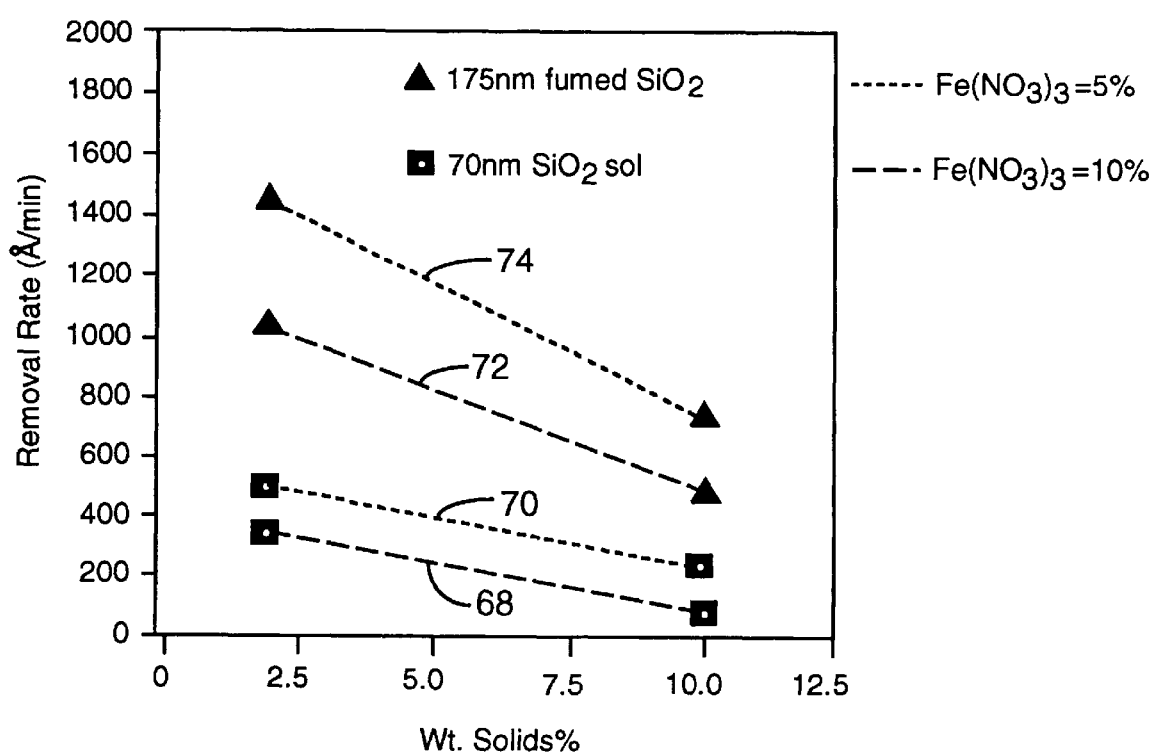
FIG. 7 illustrates the effect of abrasive solids concentration on removal rate for different abrasive particles.

Referring to FIG. 7, the removal rate for a first abrasive sol $SiO_2$ particle combined with five (5) percent of an oxidant $(Fe(NO_3)_3)$ at varying weight percent is shown by a line 68. The same $SiO_2$ sol particle on the order of seventy (70) mm, combined with ten (10) percent of the oxidant results in a line 70. It is speculated that the decrease in the removal rate with an increase in the percent solids, is caused by dispersing of the load on each particle along with exclusion of the oxidant/oxidizing slurry fluid, which decreases the removal rate.

Utilization of larger abrasive $SiO_2$ particles on the order of one hundred seventy-five (175) mm at five (5) percent oxidant concentration results in an increased removal rate, line 72. These $SiO_2$ particles also are fumed and hence also may have a more abrasive irregular structure than the sol $SiO_2$ particles. Again an increase in the oxidant percent to ten (10) results in an increased removal rate, line 74.

Figure 8:
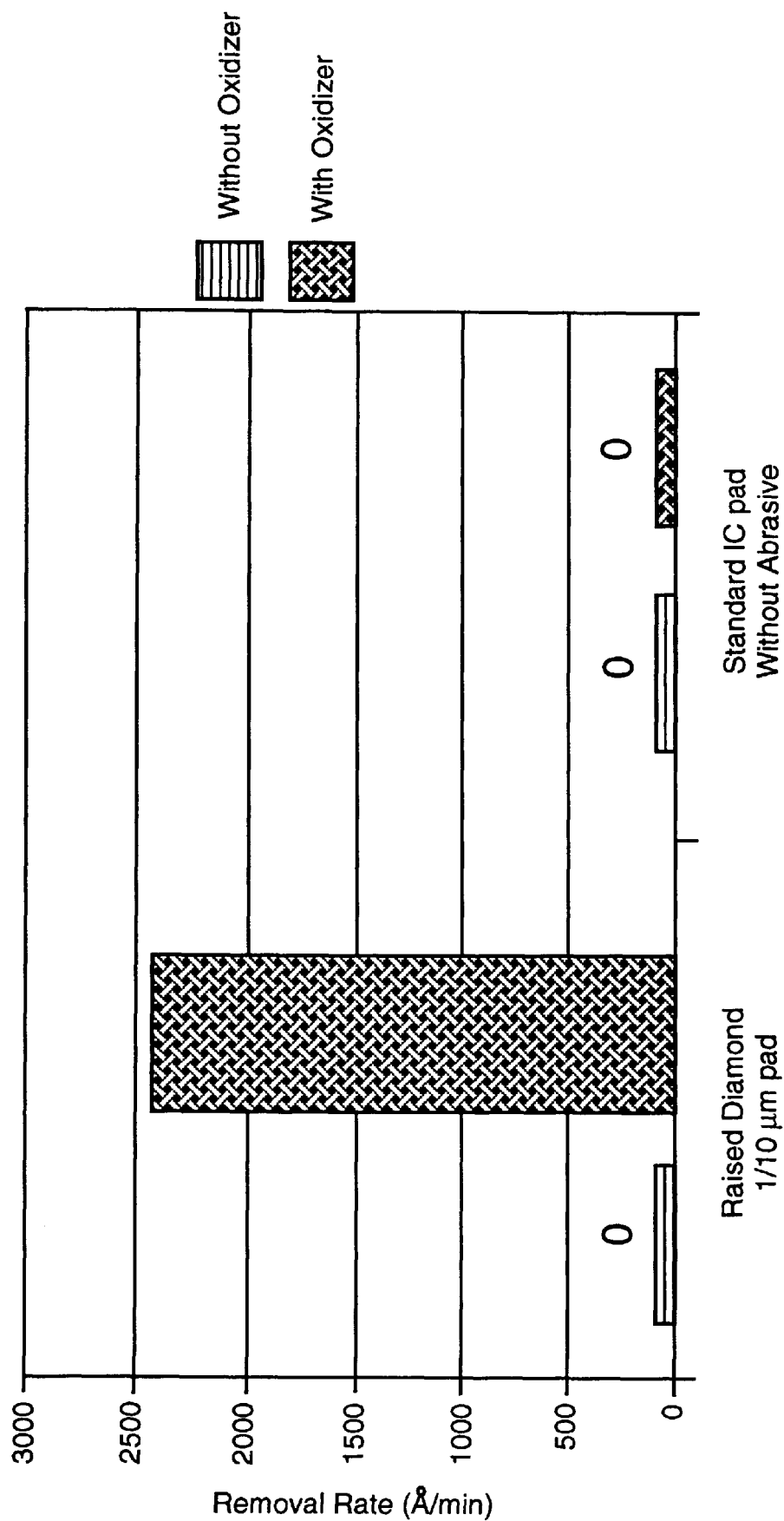
FIG. 8 illustrates the effect of the oxidizing slurries on two types of pads.

Referring to FIG. 8, the results of a ferric nitrate oxidizer solution of pH 1.5 is illustrated with two different pads, like the pads 16. A commercially available diamond film type abrasive pad, such as sold by Moyco Technologies, Inc. of Montgomeryville, Pa., under the name type-S (0.1 micron), results in essentially no removal when utilized in D.I. water without an oxidizer. The same pad results in a removal rate of about two thousand four hundred (2400) Angstroms per minute with the addition of the ferric nitrate oxidizer. In contrast a commercially available non-abrasive IC pad, such as sold by Rodel of Newark, Del., under the name IC1400, does not include an entrained or surface abrasive. Therefore, the removal rate is zero with and without the oxidizer. These results clearly demonstrate the requirement of both an abrasive and an oxidizer or oxidizing agent to achieve a desirable removal rate for the low dielectric constant material.

Figure 9:
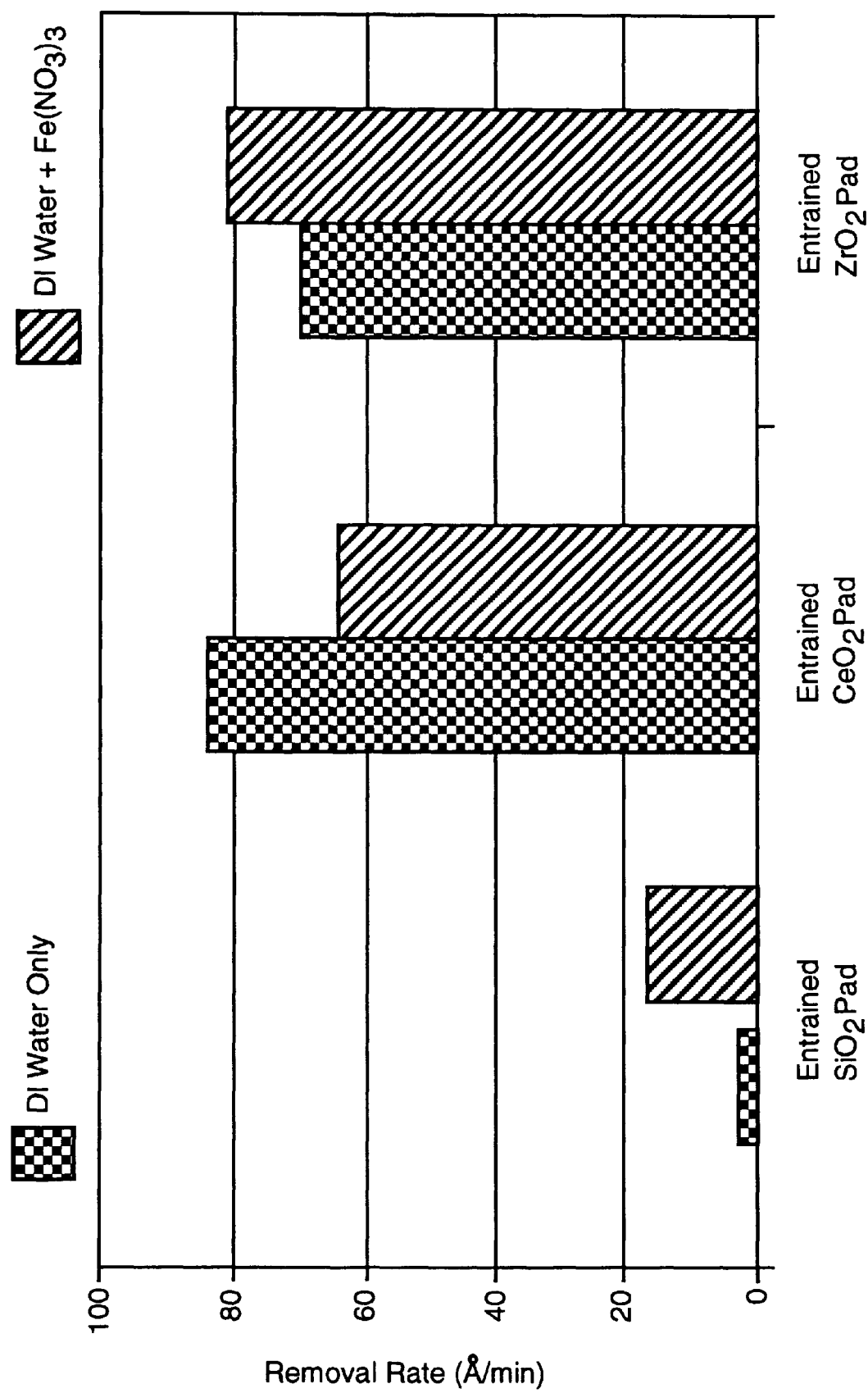
FIG. 9 illustrates the CMP removal rate of the low dielectric constant material with entrained abrasive pads.

FIG. 9 illustrates the removal rate with and without oxidizer for several different abrasive entrained pads again, like the pads 16. A first abrasive entrained pad, including $SiO_2$ particles, such as made by Universal Photonics, Inc. Hicksville, N.Y., under the name LP-99, with DI water but without an oxidizer resulted in an essentially zero removal rate. The addition of six (6) percent by weight of an oxidizer $(Fe(NO_3)_3)$ increased the removal rate to the order of seventeen (17) Angstroms per minute. A second $CeO_2$ entrained pad, including $CeO_2$ particles, such as made by Universal Photonics, Inc., under the name TLP-88, in DI water but without a separate oxidizer, resulted in a removal rate of about eighty-four (84) Angstroms per minute. Addition of six (6) percent by weight of the oxidizer $(Fe(NO_3)_3)$ resulted in a decreased removal rate of about sixty-four (64) Angstroms per minute. In this case, the oxidizer clearly is competing/interfering with the oxidizer reaction of the $CeO_2$ particles alone. A third $ZrO_2$ entrained pad, including $ZrO_2$ particles, such as made by Universal Photonics, Inc., under the name GR-35, with DI water, but without a separate oxidizer resulted in a removal rate of about seventy (70) Angstroms per minute. The addition of the $Fe(NO_3)_3$ oxidizer appears to be compatible with the $ZrO_2$ oxidizer and results in an increased removal rate of about eighty-one (81) Angstroms per minute. These removal rates are too low to be commercially viable, but illustrate the oxidizer effect on compatible and non-compatible abrasive particles. The entrained abrasive pads may be useful when combined with a non-entrained abrasive slurry of the present invention.

Figure 10:
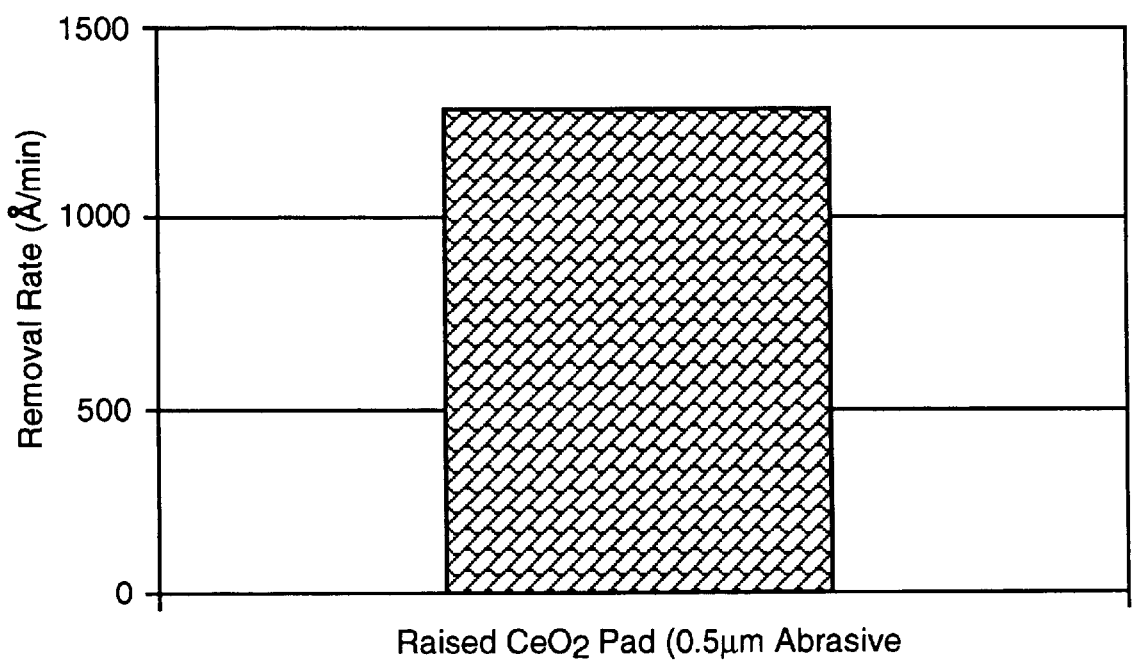
FIG. 10 illustrates the CMP removal rate with a different abrasive pad.

Referring to FIG. 10, an experimental pad made by 3M Corporation, having one half (0.5) micron $CeO_2$ particle abrasives adhered to the pad surface (like sandpaper) results in a removal rate of over twelve hundred (1200) Angstroms per minute with only DI water. This result clearly demonstrates the fact that the $CeO_2$ abrasive forms both the abrasive and the oxidizing function necessary to obtain removal of the dielectric material.

Although the tests so far indicate that introducing the abrasive particles to the surface of the dielectric polymer material in combination with an oxidizer is optimal, other fixed abrasive embodiments could be utilized such as that illustrated in FIGS. 8–10. The abrasive could be in a gel form and could be bonded directly to the surface of or incorporated within a suitably thick compliant polishing substrate in a separate manufacturing process. This potentially could eliminate the liquid oxidizing slurry, since the abrasive coated compliant substrate could act as the fixed abrasive polishing pad with the oxidizer in the chemically active particles. The technique could also be extended to incorporate the particles into a polymeric matrix within the bulk of or at the surface of the polishing pad 16. A combination of these approaches may be optimal for some applications.

For the abrasive particles of the present invention, the diameter range for polishing the low dielectric constant materials is on the order of three (3) nanometers (nm) up to one thousand (1000) nm (or one micron), preferably on the order of fifty (50) nm to two hundred and fifty (250) nm. The concentration of the particles in the slurry solution by weight percent (wt %) is from about one tenth (0.1) to thirty (30) percent; preferably two (2) to fifteen (15) percent.

The particle slurry of the present invention preferably is formed having a multi-modal particle size distribution, which includes one or more sets of small diameter particles combined with one or more sets of larger diameter particles. U.S. Pat. No. 5,527,370 discloses that a bi-modal particle size distribution provides a higher grinding rate and better surface finish for metals and inorganic materials than a mono-disperse abrasive system. Applicants believe this also to be the case for polishing the low dielectric constant materials described herein.

The abrasive particles of the present invention can be formed from carbon or diamond or one or more of the carbides, nitrides, oxides or hydrated oxides of the following metals:

antimony, aluminum, boron, calcium, cerium, chromium, copper, gadolinium, germanium, hafnium, indium, iron, lanthanum, lead, magnesium, manganese, neodymium, nickel, scandium, silicon, terbium, tin, titanium, tungsten, vanadium, yttrium, zinc, or zirconium.

The particles are not necessarily one hundred percent pure and can also purposely be formed from a combination of the metal oxides, hydrated oxides, carbides, or nitrides. The core 54 essentially can be any material which can be coated with the abrasive materials of the present invention. Small amounts of other materials also can be utilized, if desired. The inactive oxide core 54 or mixture 60 can be $SiO_2$ or can be other oxides or other low density materials as desired.

The present invention thus specifically encompasses abrasive particle slurries with an oxidizing agent, which can be provided by:

(1) Inactive abrasive particle combined with a separate oxidizing agent, such as $SiO_2$ and $Fe(NO_3)_3$.

(2) Active reducible abrasive particles with multiple valence states, which provide both the abrasive particle and the oxidizing agent, such as $CeO_2$ and $SnO_2$.

(3) Reducible abrasive particles combined with a compatible oxidizing agent, such as $ZrO_2$ and $HNO_3$.

Although the present invention has been described with reference to particular embodiments, the described embodiments are examples of the present invention and should not be taken as limitations. For example, the abrasive particles of the present invention have been described as being preferably maintained in a suspension or dispersion; however, the particles could be in gel form and the particles also could be adhered to or be formed as part of the surface of the pad 16 (not illustrated). A combination of these features also could be utilized. Further although specific abrasive particles have been described, virtually any particle which is harder than the low dielectric constant material effectively can be utilized with an oxidizing agent. Also, although the pad 16 has been illustrated as a rigid platen mounted polishing pad, it can include any semi-rigid surface, such as formed on or part of a rotating sphere, rod or cylinder, belt or pad, etc. (not illustrated) As will be appreciated by those skilled in the art, various other adaptations and combinations of the embodiments described herein are within the scope of the present invention as defined by the attached claims.

We claim:

1. An abrasive composition for polishing polymer-based materials or materials having a dielectric constant value less than 3, the composition comprising:
   an oxidizing slurry that comprises a plurality of oxidizing abrasive particles, wherein the oxidizing abrasive particles are chemically reactive with the polymer-based materials or the dielectric material to aid in the removal of the polymer-based materials or the dielectric material; and
   an additional oxidizing agent.

2. The abrasive composition of claim 1, wherein the oxidizing abrasive particles include multiple valence states.

3. The abrasive composition of claim 1, wherein the oxidizing agent is compatible with the oxidizing abrasive particles.

4. The abrasive composition of claim 1, wherein the oxidizing abrasive particles are formed from an active metal oxide combined with an inactive oxide.

5. The abrasive composition of claim 4, the metal oxide is formed as a coating over said inactive oxide.

6. The abrasive composition of claim 4, wherein the inactive oxide is $SiO_2$.

7. The abrasive composition of claim 1, wherein the additional oxidizing agent comprises ferric nitrate, cupric nitrate, zirconyl nitrate, ferric chloride, potassium permanganate, potassium ferricyanide, nitric acid, organic or inorganic peroxides, wherein inorganic peroxides comprises hydrogen peroxide, peracetic acid, potassium iodate or benzoyl peroxide.

8. The abrasive composition of claim 1, wherein the oxidizing abrasive particles have a multi-modal size distribution.

9. The abrasive composition of claim 8, wherein the oxidizing abrasive particles have a bi-modal size distribution, including a plurality of small diameter particles and a second lesser amount of a plurality of large diameter particles.

10. The abrasive composition of claim 1, wherein the slurry is formed in a dispersion with a pH of about one half to eleven.

11. The abrasive composition of claim 10, wherein the dispersion has a pH of about one to five.

12. A The abrasive composition of claim 1, wherein the oxidizing slurry is formed as a liquid dispersion.

13. The abrasive composition of claim 1, wherein the oxidizing agent includes a plurality of reducible metal ions which oxidize the dielectric material or the polymer-based material.

14. An abrasive composition for polishing polymer-based materials or materials having a dielectric constant value less than 3, the composition comprising:
   an oxidizing slurry that comprises a plurality of abrasive particles, wherein the abrasive particles comprise carbon, diamond antimony, boron, calcium, chromium, copper, gadolinium, germanium, hafnium, indium, iron, lanthanum, lead, magnesium, manganese, neodymium, nickel, scandium, terbium, tin, titanium, tungsten, vanadium, yttrium, zinc or zirconium; and
   wherein the slurry includes an oxidizing agent that is chemically reactive with the polymer-based material or the dielectric material to aid in the removal of the polymer-based material or the dielectric material.

15. The abrasive composition of claim 14, wherein the abrasive particles are substantially inactive and the oxidizing agent is a separate agent from the particles.

16. The abrasive composition of claim 14, wherein the abrasive particles include multiple valence states and are reducible to provide the oxidizing agent.

17. The abrasive composition of claim 14, wherein the abrasive particles include multiple valence states and wherein the oxidizing agent is a separate oxidizing agent compatible with the abrasive particles.

18. The abrasive composition of claim 14, wherein the abrasive particles are formed from an active metal oxide combined with an inactive oxide.

19. The abrasive composition of claim 18, wherein the metal oxide is formed as a coating over said inactive oxide.

20. The abrasive composition of claim 18, wherein the inactive oxide is $SiO_2$.

21. The abrasive composition of claims 14, wherein the oxidizing agent is a separate agent from the particles and comprises ferric nitrate, cupric nitrate, zirconyl nitrate, ferric chloride, potassium permanganate, potassium ferricyanide, nitric acid, organic or inorganic peroxides, wherein the inorganic peroxides comprise hydrogen peroxide, peracetic acid, potassium iodate or benzoyl peroxide.

22. The abrasive composition of claim 14, wherein the abrasive particles have a multi-modal size distribution.

23. The abrasive composition of claim 22, wherein the abrasive particles have a bi-modal size distribution, including a plurality of small diameter particles and a second lesser amount of a plurality of large diameter particles.

24. The abrasive composition of claim 14, wherein the slurry is formed in a dispersion with a pH of about one half to eleven.

25. The abrasive composition of claim 24, said dispersion has a pH of about one to five.

26. The abrasive composition of claim 14, wherein the oxidizing slurry is formed as a liquid dispersion.

27. The abrasive composition of claim 14, wherein the oxidizing agent includes a plurality of reducible metal ions which oxidize the dielectric material or the polymer-based material.

* * * * *